(12) United States Patent
Shirai et al.

(10) Patent No.: US 11,527,643 B2
(45) Date of Patent: Dec. 13, 2022

(54) TRENCH GATE MOSFET AND METHOD OF MANUFACTURING THE SAME

(71) Applicant: uPI Semiconductor Corp., Hsinchu County (TW)

(72) Inventors: Nobuyuki Shirai, Hsinchu County (TW); Chun-Hsu Chang, Hsinchu County (TW); Ming-Hung Chou, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 51 days.

(21) Appl. No.: 17/342,567

(22) Filed: Jun. 9, 2021

(65) Prior Publication Data

US 2021/0296493 A1    Sep. 23, 2021

Related U.S. Application Data

(62) Division of application No. 16/412,427, filed on May 15, 2019, now Pat. No. 11,075,296.

(30) Foreign Application Priority Data

May 16, 2018    (TW) .................................. 107116645

(51) Int. Cl.
| | | |
|---|---|---|
| H01L 29/78 | (2006.01) | |
| H01L 29/423 | (2006.01) | |
| H01L 21/033 | (2006.01) | |
| H01L 29/66 | (2006.01) | |

(52) U.S. Cl.
CPC ...... *H01L 29/7813* (2013.01); *H01L 21/0332* (2013.01); *H01L 21/0337* (2013.01); *H01L 29/4236* (2013.01); *H01L 29/66734* (2013.01)

(58) Field of Classification Search
None
See application file for complete search history.

(56) References Cited

U.S. PATENT DOCUMENTS

| | | | |
|---|---|---|---|
| 2013/0234241 A1* | 9/2013 | Bowers | H01L 29/66734 257/330 |
| 2017/0018547 A1* | 1/2017 | Naito | H01L 29/0615 |
| 2017/0170288 A1* | 6/2017 | Kiyosawa | H01L 21/02378 |
| 2018/0097069 A1* | 4/2018 | Utsumi | H01L 29/1608 |
| 2019/0109216 A1* | 4/2019 | Cai | H01L 21/32055 |

* cited by examiner

*Primary Examiner* — Mark W Tornow
*Assistant Examiner* — Priya M Rampersaud
(74) *Attorney, Agent, or Firm* — JCIPRNET

(57) ABSTRACT

Provided is a method of forming a trench gate MOSFET. A hard mask layer is formed on a substrate. The substrate is partially removed by using the hard mask layer as a mask, so as to form a trench in the substrate. A first insulating layer and a first conductive layer are formed in the lower portion of the trench. A sacrificial layer is formed on the side surface of the upper portion of the trench, and the sacrificial layer is connected to the hard mask layer. An interlayer insulating layer is formed on the first conductive layer by a thermal oxidation process when the sacrificial layer and the hard mask layer are present. A second insulating layer and a second conductive layer are formed in the upper portion of the trench. A trench gate MOSFET is further provided.

4 Claims, 6 Drawing Sheets

TRENCH GATE MOSFET AND METHOD OF MANUFACTURING THE SAME

CROSS-REFERENCE TO RELATED APPLICATION

This application is a divisional application of and claims the priority benefit of U.S. patent application Ser. No. 16/412,427, filed on May 15, 2019, now allowed. The U.S. patent application Ser. No. 16/412,427 claims the priority benefit of Taiwan application serial no. 107116645, filed on May 16, 2018. The entirety of each of the above-mentioned patent applications is hereby incorporated by reference herein and made a part of this specification.

BACKGROUND OF THE INVENTION

Field of Invention

The present invention relates to a transistor and a method of manufacturing the same, and more particularly to a trench gate MOSFET and a method of manufacturing the same.

Description of Related Art

Power switch transistors are widely used in power switch devices, such as power supplies, rectifiers, low voltage motor controllers or the like. A common power switch transistor is a trench gate MOSFET. In the process of a conventional trench gate MOSFET, the top edge of a trench is severely deformed by a thermal oxidation process, resulting in difficulty of controlling the depth of the subsequently formed doped region. More specifically, the top edge of the trench may be over-expanded and severely tilted, causing a significant height difference between the bottom surface of the doped region close to the trench and the bottom surface of the same doped region away from the trench. Such contour difference of the doped region reduces the process stability of the transistor, especially for the short channel trench gate MOSFET device.

SUMMARY OF THE INVENTION

Accordingly, the present invention provides a method of manufacturing a trench gate MOSFET, in which the trench gate MOSFET is formed with the existing process while the top edge of the trench is not deformed by a thermal oxidation process, and thus, the process stability of the transistor is improved.

The present invention provides a method of manufacturing a trench gate MOSFET that includes the following steps. A hard mask layer is formed on a substrate. The substrate is partially removed by using the hard mask layer as a mask, so as to form a trench in the substrate. A first insulating layer and a first conductive layer are formed in a lower portion of the trench. A sacrificial layer is formed on a sidewall of an upper portion of the trench, and the sacrificial layer is connected to the hard mask layer. An interlayer insulating layer is formed on the first conductive layer by a thermal oxidation process when the sacrificial layer and the hard mask layer are present. A second insulating layer and a second conductive layer are formed in the upper portion of the trench.

According to an embodiment of the present invention, the method further includes removing the sacrificial layer and the hard mask layer after forming the interlayer insulating layer.

According to an embodiment of the present invention, the method further includes removing the sacrificial layer and a portion of the hard mask layer after forming the interlayer insulating layer.

According to an embodiment of the present invention, a material of the remaining hard mask layer includes silicon nitride or silicon oxynitride after removing the portion of the hard mask layer.

According to an embodiment of the present invention, the hard mask layer is a multi-layer composite structure, and a material of the sacrificial layer is the same as a material of one layer of the hard mask layer.

According to an embodiment of the present invention, after forming the interlayer insulating layer, the trench has a width W1 at a surface of the substrate and a width W2 at a depth of 100-150 nm from the surface of the substrate, and a ratio of W1 to W2 is greater than 1 and less than 1.08.

The present invention provides a trench gate MOSFET that includes a substrate, a first conductive layer, a first insulating layer, a second conductive layer, a second insulating layer and an interlayer insulating layer. The substrate has a trench therein. The first conductive layer is disposed in a lower portion of the trench. The first insulating layer is disposed between the first conductive layer and the substrate. The second conductive layer is disposed in the trench and located on the first conductive layer. The second insulating layer is disposed between the second conductive layer and the substrate. The interlayer insulating layer is disposed between the first conductive layer and the second conductive layer, and the interlayer insulating layer is dielectric oxide. Besides, the trench has a width W1 at a surface of the substrate and a width W2 at a depth of 100-150 nm from the surface of the substrate, and a ratio of W1 to W2 is greater than 1 and less than 1.08.

According to an embodiment of the present invention, the trench gate MOSFET further includes a nitrogen-containing hard mask layer disposed on the substrate beside the trench.

According to an embodiment of the present invention, a top surface of a central portion of the interlayer insulating layer is higher than a top surface of an edge portion of the interlayer insulating layer.

According to an embodiment of the present invention, a nitrogen-containing hard mask layer is present on the surface of the substrate beside the trench when the interlayer insulating layer is formed by a thermal oxidation process.

Based on the above, the manufacturing method of the present invention is simple, and the process stability of the transistor can be easily improved by using the existing process. In the trench gate MOSFET of the present invention, the top corner of the trench is not severely deformed by a thermal oxidation process. That is, the surface of the substrate and the upper sidewall of the trench are maintained at a substantially right angle around the top corner of the trench, so that the depth of the subsequently formed doped region is easily controlled to make the depth uniform, and the process stability of the device is greatly improved.

In order to make the and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and a part of the specification. The drawings are embodi

DESCRIPTION OF SECURITIES

Figure 1A:
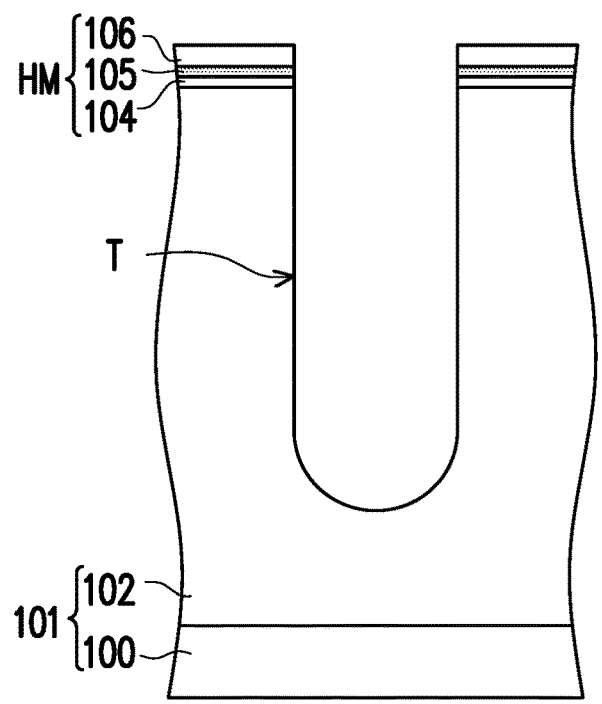
- FIG. 1A to FIG. 1G are schematic cross-sectional views of a method of manufacturing a trench gate MOSFET according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic cross-sectional views of a method of manufacturing a trench gate MOSFET according to a first embodiment of the present invention.

Referring to FIG. 1A, a substrate 101 is provided. In an embodiment, the substrate 101 includes a base layer 100 and an epitaxial layer 102 formed on the base layer 100. In an embodiment, the base layer 100 is a semiconductor base layer having a first conductivity type, such as an N-type heavily doped silicon-base layer. In an embodiment, the epitaxial layer 102 is an epitaxial layer having the first conductivity type, such as an N-type lightly doped epitaxial layer, and the forming method thereof includes performing a selective epitaxial growth (SEG) process.

Thereafter, a hard mask layer HM is formed on the substrate 101, and the hard mask layer HM exposes a portion of the substrate 101. In an embodiment, a hard mask material layer is formed on the epitaxial layer 102. In an embodiment, the method of forming the hard mask material layer includes performing a thermal oxidation process, a chemical vapour deposition (CVD) process or a combination thereof. Then, a pattering process (e.g., photolithography and etching process) is performed to the hard mask material layer, so as to form the hard mask layer HM. In an embodiment, the hard mask layer HM is a nitrogen-containing hard mask layer. For example, the material of the hard mask layer HM may include silicon nitride or silicon oxynitride. In an embodiment, the hard mask layer HM has a three-layer composite structure including, from bottom to top, a silicon oxide layer 104, a silicon nitride layer 105 and a silicon oxide layer 106, as shown in FIG. 1A. In an embodiment, the thickness of the silicon oxide layer 106 is greater than the thickness of the silicon oxide layer 104.

In addition, the structure of the hard mask layer HM is not limited to FIG. 1A. In another embodiment, the hard mask layer HM may have a four-layer composite structure including a silicon oxide layer, a silicon nitride layer, a silicon oxynitride layer and a silicon oxide layer, a two-layer composite structure including a silicon oxide layer and a silicon nitride layer, a single-layer structure including silicon oxynitride, or any suitable structure.

Afterwards, the substrate 101 is partially removed by using the hard mask layer HM as a mask, so as to form a trench T. In an embodiment, the trench T has a substantially vertical sidewall, as shown in FIG. 1A.

Figure 1B:
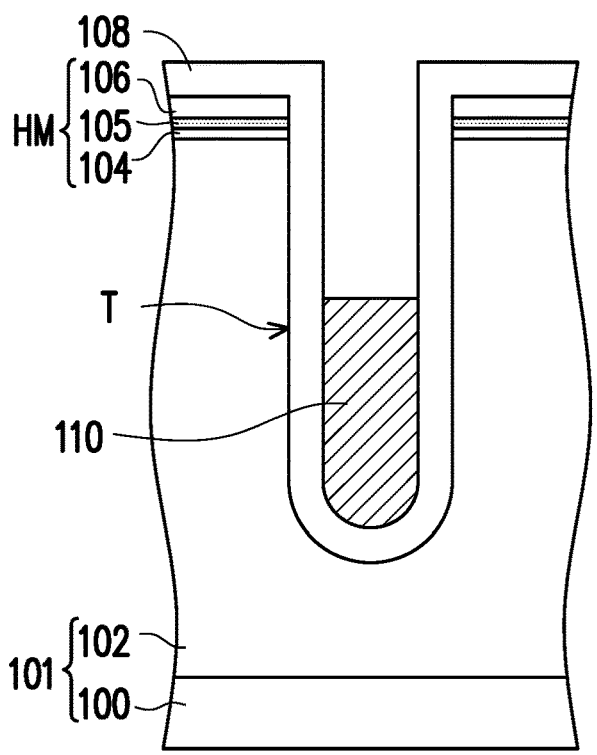
Figure 1C:
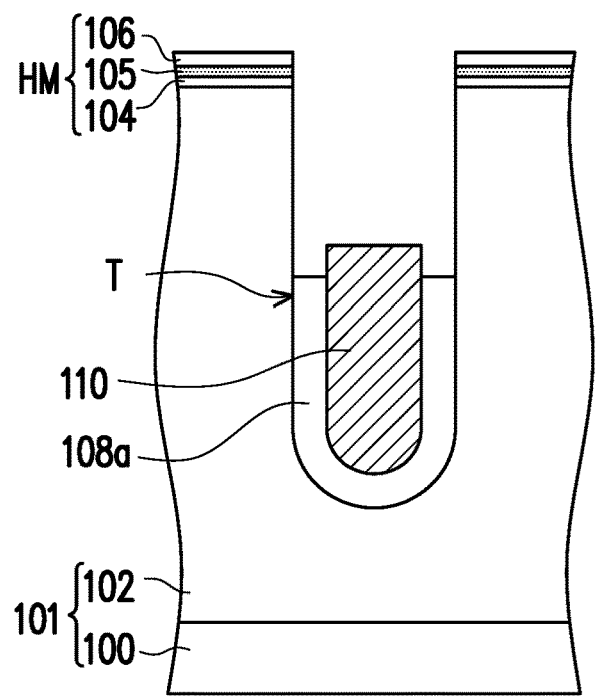

Referring to FIG. 1B and FIG. 1C, a first insulating layer 108a and a first conductive layer 110 are formed in a lower portion of the trench T. As shown in FIG. 1B, a first insulating material layer 108 is formed on the surface of the trench T and on the top surface of the hard mask layer HM. In an embodiment, the material of the first insulating material layer 108 includes silicon oxide, and the forming method thereof includes performing a chemical vapour deposition process. Next, the first conductive layer 110 is formed in the lower portion of the trench T. In an embodiment, a first conductive material layer is formed on the first insulating material layer 108, and the first conductive material layer completely fills the trench T. The material of the first conductive material layer includes doped polysilicon, and the forming method thereof includes performing a chemical vapour deposition process. Then, the first conductive material layer is partially removed until the top surface of the remaining first conductive material layer is lower than the top surface of the substrate 101 or the epitaxial layer 102. The removing step includes performing an etching process.

Next, as shown in FIG. 1C, the first insulating material layer 108 is partially removed to form the first insulating layer 108a, and the first insulating layer 108a exposes a portion of the epitaxial layer 102. The removing step includes performing an etching process. In an embodiment, the step of partially removing the first insulating material layer 108 also removes a portion of the hard mask layer HM. More specifically, a portion of the silicon oxide layer 106 is also removed. In an embodiment, the top surface of the first insulating layer 108a is lower than the top surface of the first conductive layer 110.

Figure 1D:
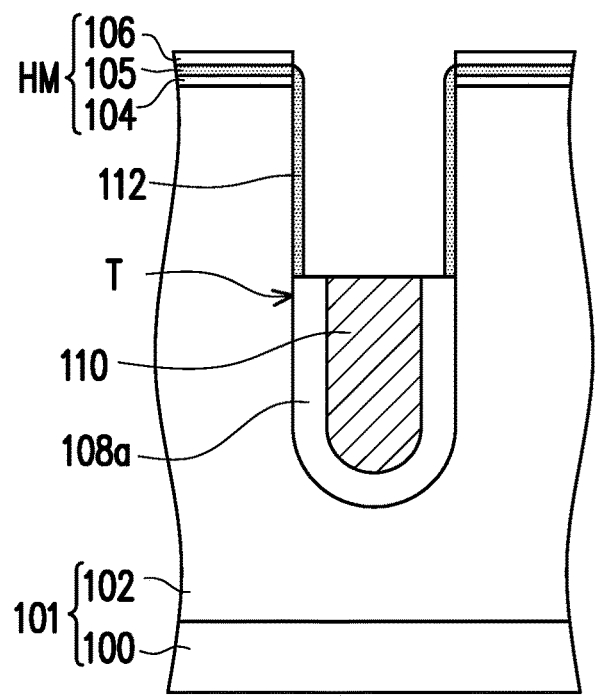

Referring to FIG. 1D, a sacrificial layer 112 is formed on the sidewall of an upper portion of the trench T. In an embodiment, a sacrificial material layer is formed on the substrate 101, and the sacrificial material layer covers the top surface of the hard mask layer HM, the sidewall of the upper portion of the trench T, and the top surfaces of the first insulating layer 108a and the first conductive layer 110. Then, an anisotropic etching process is performed to partially remove the sacrificial material layer, so as to form the sacrificial layer in the form of a spacer 112. In an embodiment, a portion of the first conductive layer 110 is optionally removed, so that the top surface of the first conductive layer 110 is substantially flush with the top surface of the first insulating layer 108a.

Figure 1E:
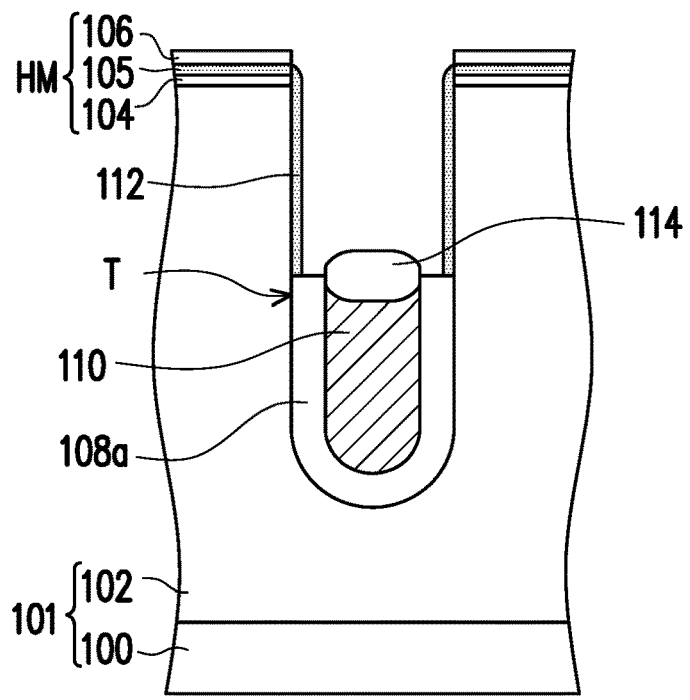

Referring to FIG. 1E, an interlayer insulating layer 114 is formed on the first conductive layer 110. In an embodiment, the material of the interlayer insulating layer 114 includes silicon oxide, and the forming method thereof includes performing a thermal oxidation process. In an embodiment, the top surface of the interlayer insulating layer 114 is higher than the top surface of the interlayer insulating layer 108a. In an embodiment, the top surface of interlayer insulating layer 114 has a substantially arc shape, and the top surface of the central portion is higher than the top surface of the edge portion of the interlayer insulating layer 114.

In the present invention, the sacrificial layer 112 includes a material the same as that of the hard mask layer HM, and the sacrificial layer 112 and the hard mask layer HM are connected to form a protective structure to protect the top corner of the trench T from being affected by the thermal oxidation process during the formation of the interlayer insulating layer 114. By such manner, the shape of the top edge of the trench remains substantially unchanged; that is, the substrate surface and the top sidewall of the trench T are maintained at a substantially right angle at the top corner of the trench T. In general, the process of forming the interlayer insulating layer takes a long time, causing severe deformation of the top corner of the trench T, resulting in difficulty of controlling the implantation depth of the subsequent doped region to be uniform. However, in the present invention, the protection structure constituted by the sacrificial layer 112 and the hard mask layer HM can protect the top corner of the trench T and maintain a substantially right angle at the top corner, so the conventional inconsistent depth of the doped region caused by deformation of the top corner is not observed.

Figure 1F:
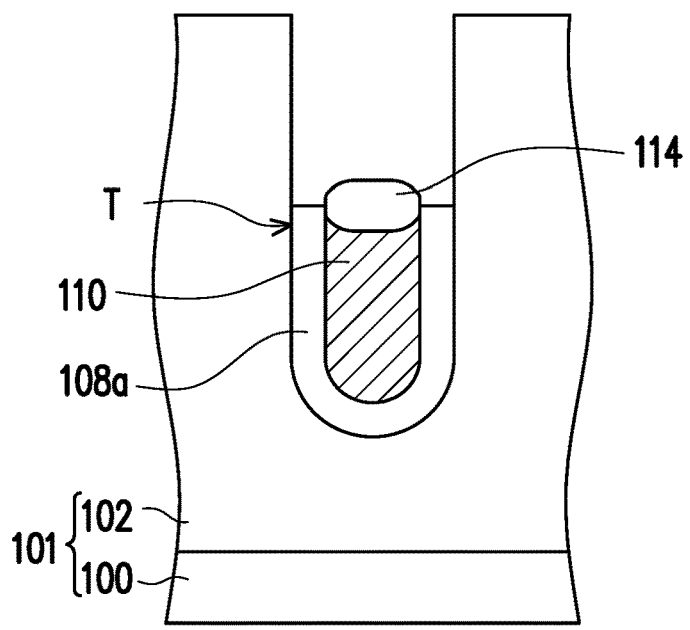

Referring to FIG. 1F, the sacrificial layer 112 and at least a portion of the hard mask layer HM are removed. In an embodiment, at least one etching process is performed to remove all the sacrificial layer 112 and all the hard mask layer HM. After the removing step, the top corner of the trench T remains intact, and the included angle between the sidewall of the upper portion of the trench T and the surface of the substrate 101 is approximately 90 degrees.

Figure 1G:
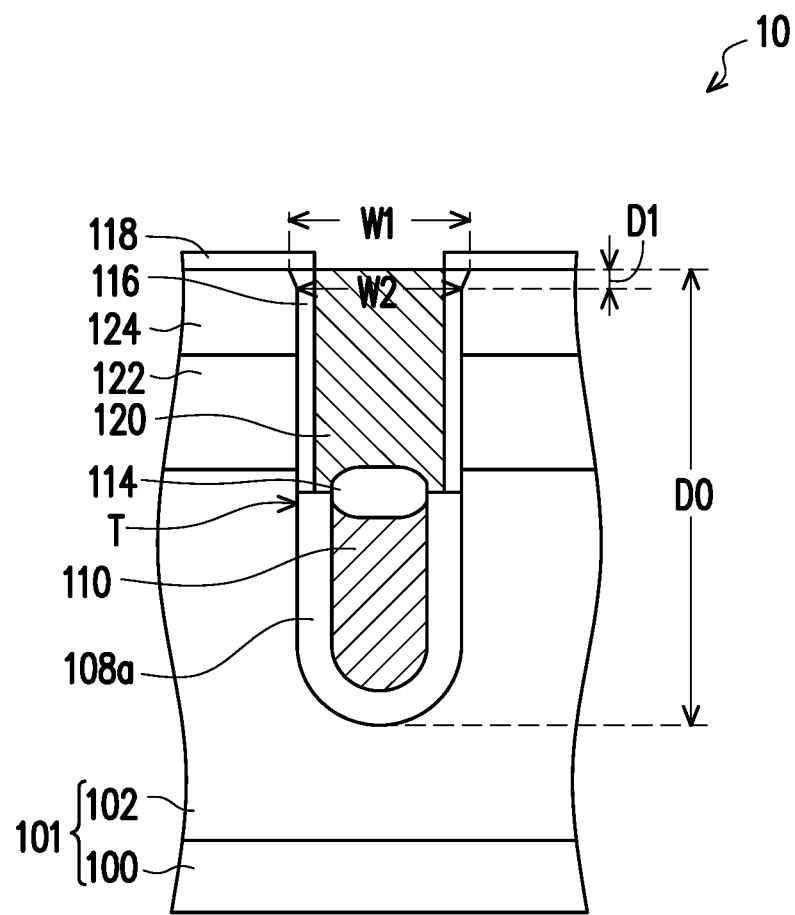

Referring to FIG. 1G, a second insulating layer 116 and a second conductive layer 120 are formed in the upper portion of the trench T. First, the second insulating layer 116 is formed in the trench T, and covers the sidewall of the upper portion of the trench T. In an embodiment, the material of the second insulating layer 116 includes a silicon oxide, and the forming method thereof includes performing a thermal oxidation process. Specifically, the material of the second insulating layer 116 is dielectric oxide, such as silicon oxide. Herein, dielectric oxide is prepared by a thermal oxidation process, and a surface portion of silicon is consumed to form silicon oxide. The thermal oxidation process consumes a portion of the substrate 101, so that the top corner of the trench T is slightly expanded. After the thermal oxidation process, the included angle between the trench T and the substrate 101 is greater than 90 degrees and less than 110 degrees or even less than 105 degrees.

In the embodiment, the trench T has a width W1 at the surface of the substrate and a width W2 at a depth D1 from the surface of the substrate 101. In an embodiment, when the depth D1 is about 100 to 150 nm, the ratio of W1 to W2 is greater than 1 and less than 1.08, for example.

Besides, in the case that the maximum depth of the trench T is D0, the trench T has a slightly inclined sidewall from the substrate surface to the depth D1 below the substrate surface, and has a substantially vertical sidewall from the depth D1 to the depth D0 below the substrate surface. For example, when the depth D1 is about 100 to 150 nm, the ratio of W1 to W2 is greater than 1 and less than 1.08, and the width of the trench T from the substrate surface to the depth D1 below the substrate surface is linearly decreased; and when the depth is greater than 100-150 nm, the width of the trench T is approximately the same.

More specifically, the top of the trench is tilted slightly; that is, the depth D1 merely ranges from 100 to 150 nm and the included angle between the trench T and the substrate 101 is only slightly greater than 90 degrees and less than 110 degrees. Therefore, the top edge of the trench remains substantially intact, which will not affect the depth of the subsequently formed doped region 124. Therefore, in the present invention, the subsequently formed doped region 124 has no significant depth difference between the bottom surface of the doped region 124 close to the trench T and the bottom surface of the same doped region 124 away from the trench T. The depth of the doped region 124 is substantially maintained at the same level.

Then, a screen insulating layer 118 is formed on the surface of the substrate 101. The material of the screen insulating layer 118 includes silicon oxide, and the forming method thereof includes performing a thermal oxidation process or a chemical vapour deposition process. The screen insulating layer 118 can serve as an implant mask for the subsequently formed body layer 122 and doped region 124.

In an embodiment, the second insulating layer 116 and the screen insulating layer 118 may be formed in different steps, and the second insulating layer 116 is connected to the screen insulating layer 118, as shown in FIG. 1G. However, the present invention is not limited thereto.

In another embodiment, the second insulating layer 116 and the screen insulating layer 118 may be formed in the same step. For example, the second insulating layer 116 and the screen insulating layer 118 are formed by performing a chemical vapour deposition process, and thus, the top corner of the trench T can be maintained intact, and the included angle between trench T and substance 101 is approximately 90 degrees.

Still referring to FIG. 1G, the second conductive layer 120 is formed in the upper portion of the trench T. In an embodiment, a second conductive material layer is formed on the epitaxial layer 102, and the second conductive material layer completely fills the trench T. In an embodiment, the material of the second conductive material layer includes doped polysilicon, and the forming method thereof includes performing a chemical vapour deposition process. Thereafter, a chemical mechanical polishing process and/or an etching process is performed to remove the second conductive material layer outside the trench T.

Then, a body layer 122 is formed in the epitaxial layer 102. In an embodiment, the body layer 122 is a body layer having a second conductivity type, such as a P-type body layer, and the forming method thereof includes performing an ion implantation process.

Next, a doped region 124 is formed in the body layer 122. In an embodiment, the doped region 124 is a doped region 124 having the first conductivity type, such as an N-type heavily doped region, and the forming method thereof includes performing an ion implantation process. The fabrication of the trench gate MOSFET 10 of the present invention is thus completed.

In the above embodiment in which all the sacrificial layer 112 and all the hard mask layer HM are removed in the step of FIG. 1F is provided for illustration purposes, and is not construed as limiting the present invention. Another embodiment is illustrated in the following.

Figure 2A:
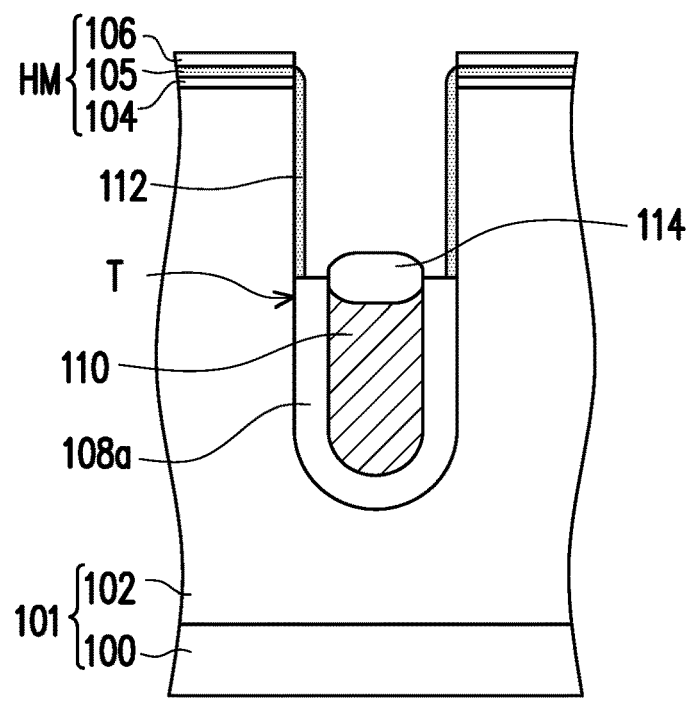
FIG. 2A to FIG. 2C are schematic cross-sectional views of a method of manufacturing a trench gate MOSFET according to a second embodiment of the present invention.
Figure 2B:
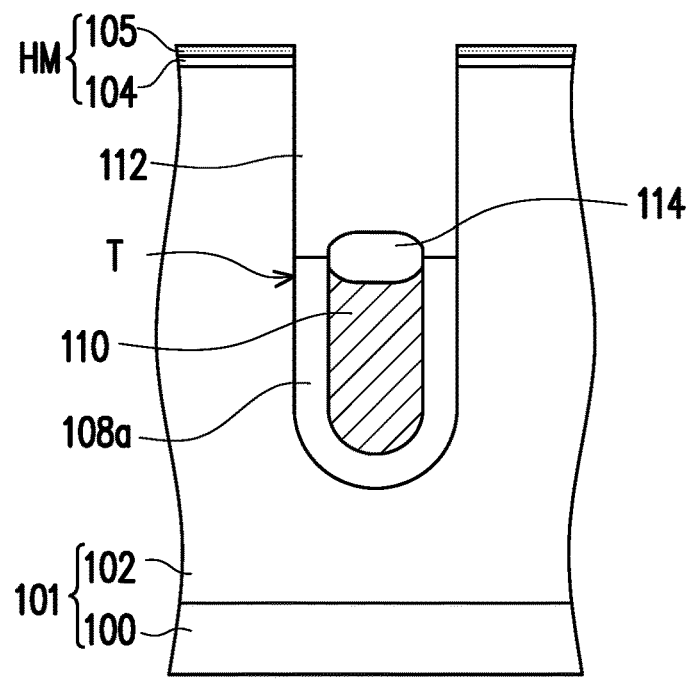
Figure 2C:
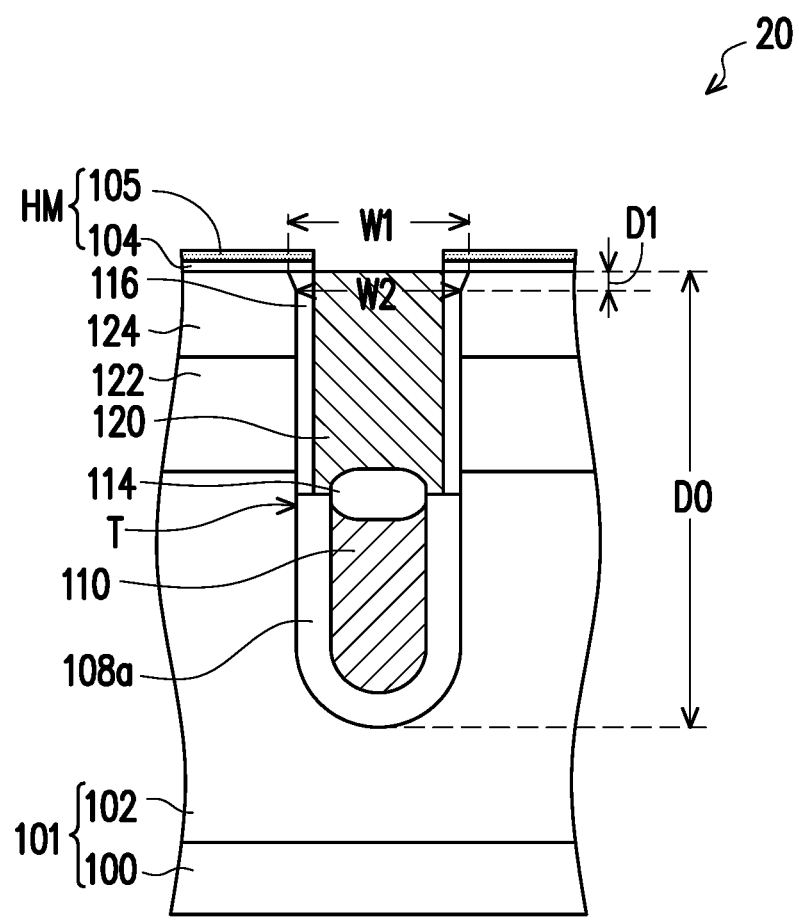

FIG. 2A to FIG. 2C are schematic cross-sectional views of a method of manufacturing a trench gate MOSFET according to a second embodiment of the present invention.

Referring to FIG. 2A, the steps of FIG. 1A to FIG. 1E are performed to form an intermediate structure as shown in FIG. 1E. Next, referring to FIG. 2B, all sacrificial layer 112 and a portion of the hard mask layer HM are removed. At least one etching process is performed to remove the entire sacrificial layer 112 and the silicon oxide layer 106 of the hard mask layer HM, leaving the silicon nitride layer 105 and the silicon oxide layer 104 of the hard mask layer HM. After the removing step, the top corner of the trench T remains intact, and the included angle between the trench T and the substrate 101 is approximately 90 degrees.

Referring to FIG. 2C, the step of FIG. 1G are performed to complete the fabrication of the trench gate MOSFET 20 of the present invention. In an embodiment, the silicon nitride layer 105 and the silicon oxide layer 104 of the hard mask layer HM can replace the step of forming the screen insulating layer 118 in FIG. 1G. In other words, the hard mask layer HM of FIG. 2C can serve as an implant mask for the subsequently formed body layer 122 and the doped region 124.

In the above embodiments, the first conductivity type is N type, and the second conductivity type is P type. However, the present invention is not limited thereto. People having ordinary skill in the art should appreciate that the first conductivity type can be P type, and the second conductivity type can be N type.

The structures of the trench gate MOSFETs of the present invention will be described below. Referring to FIG. 1G and FIG. 2C, the trench gate MOSFET 10/20 of the present invention includes a substrate 101, a first conductive layer 110, a first insulating layer 108a, a second conductive layer 120, a second insulating layer 116 and an interlayer insulating layer 114. The substrate 101 has a trench T therein. The first conductive layer 110 is disposed in an lower portion of the trench T. The first insulating layer 108a is disposed between the first conductive layer 110 and the substrate 101. The second conductive layer 120 is disposed in trench T and located on the first conductive layer 110. The second insulating layer 116 is disposed between the second conductive layer 120 and the substrate 101. The interlayer insulating layer 114 is disposed between the first conductive layer 110 and the second conductive layer 120. In addition, the trench T has a width W1 at a surface of the substrate and a width W2 at a depth of 100-150 nm from the surface of the substrate, and the ratio of W1 to W2 is greater than 1 and less than 1.08, such as 1.01, 1.02, 1.03, 1.04, 1.05, 1.06, 1.07 or 1.08, and the ratio includes any range between any two of the aforementioned values.

In an embodiment, as shown in FIG. 2C, the trench gate MOSFET 20 further includes a hard mask layer HM. The hard mask layer HM is disposed on the substrate 101 beside the trench T. In some embodiment, the hard mask layer HM is in physical contact with the second insulating layer 116. In an embodiment, the hard mask layer HM is a nitrogen-containing hard mask layer. The material of the hard mask layer HM may include silicon nitride or silicon oxynitride. The hard mask layer HM has a two-layer composite structure including, from bottom to top, a silicon oxide layer 104 and a silicon nitride layer 105, as shown in FIG. 2C. In addition, the structure of the hard mask layer HM is not limited to FIG. 2C. The hard mask layer HM may have a three-layer composite structure including a silicon oxide layer, a silicon nitride layer and a silicon oxynitride layer, a single layer including a silicon oxynitride layer, or any suitable structure.

In the trench gate MOSFET 10/20 of the present invention, the second conductive layer 120 (or the upper electrode) serves as a gate, the first conductive layer 110 (or the lower electrode) serves as a shielding gate or a source gate, the doped region 124 serves as a source, and the substrate 101 serves as a drain. The insulating layer 114 serves as an intra-gate insulating layer between the gate and the shielding gate.

In view of above, the manufacturing method of the present invention is simple, and the process stability of the transistor can be easily improved by using the existing process. In the trench gate MOSFET of the present invention, the trench top corner is not severely deformed by a thermal oxidation process; that is, the surface of the substrate and the top wall of the trench are maintained at a substantially right angle around the top corner of the trench, so the depth of the subsequently formed doped region is easily controlled to be uniform. In other words, the depth of the doped region is substantially uniform, and the process stability of the device is accordingly improved.

The present invention has been disclosed above in the preferred embodiments, but is not limited to those. It is known to persons skilled in the art that some modifications and innovations may be made without departing from the spirit and scope of the present invention. The scope of the present invention should be defined by the following claims.

What is claimed is:
1. A trench gate MOSFET, comprising:
a substrate, having a trench therein;
a first conductive layer, disposed in a lower portion of the trench;
a first insulating layer, disposed between the first conductive layer and the substrate;
a second conductive layer, disposed in the trench and located on the first conductive layer;
a second insulating layer, disposed between the second conductive layer and the substrate; and
an interlayer insulating layer, disposed between the first conductive layer and the second conductive layer, wherein the interlayer insulating layer is dielectric oxide,
wherein the trench has a width W1 at a surface of the substrate and a width W2 at a depth of 100-150 nm from the surface of the substrate, and a ratio of W1 to W2 is greater than 1 and less than 1.08.

2. The trench gate MOSFET of claim 1, further comprising a nitrogen-containing hard mask layer disposed on the substrate beside the trench.

3. The trench gate MOSFET of claim 2, wherein a top surface of a central portion of the interlayer insulating layer is higher than a top surface of an edge portion of the interlayer insulating layer.

4. The trench gate MOSFET of claim 2, wherein a nitrogen-containing hard mask layer is present on the surface of the substrate beside the trench when the interlayer insulating layer is formed by a thermal oxidation process.

* * * * *